United States Patent [19]

Sparks

[11] Patent Number: 5,661,442
[45] Date of Patent: Aug. 26, 1997

[54] AMPLITUDE CONTROL SYSTEM HAVING PARALLEL INTEGRATING SIGNAL PATHS

[75] Inventor: Stephen T. Sparks, Santa Rosa, Calif.

[73] Assignee: Hewlett-Packard Company, Palo Alto, Calif.

[21] Appl. No.: 678,355

[22] Filed: Jul. 2, 1996

[51] Int. Cl.⁶ ............................... H03C 1/06; H04B 1/04
[52] U.S. Cl. ................. 332/149; 332/107; 332/157; 332/162; 332/174; 455/126
[58] Field of Search ............................... 332/106, 107, 332/149, 155, 157, 159, 162, 174; 327/306; 455/108, 109, 126

[56] References Cited

U.S. PATENT DOCUMENTS

| | | | |
|---|---|---|---|
| 3,662,290 | 5/1972 | Elliott | 332/174 X |
| 3,737,809 | 6/1973 | Parkyn | 332/160 X |
| 3,900,823 | 8/1975 | Sokal et al. | 332/159 X |
| 4,996,500 | 2/1991 | Larson | 330/279 |
| 5,054,116 | 10/1991 | Davidson | 332/107 X |

*Primary Examiner*—David Mis
*Attorney, Agent, or Firm*—John L. Imperato

[57] ABSTRACT

An amplitude control system uses a pair of parallel integrators to rapidly adjust the amplitude of a test signal between two precisely determined power levels in an RF signal generator. The amplitude control system initializes a first power level by switching a first integrator into a feedback signal path to establish a first drive voltage, corresponding to the first power level. A second power level is initialized by switching a second integrator into the feedback signal path to establish a second drive voltage, corresponding to the second power level. The amplitude control system then alternately switches each of the integrators into the feedback signal path to alternately apply the first and second drive voltages to a level modulator, which rapidly adjusts the amplitude of the test signal to each of the two initialized power levels. An electronic step attenuator and a burst modulator, when used in conjunction with the pair of parallel integrators, enable the difference between the initialized power levels to be increased beyond the dynamic range of the level modulator and also enable the amplitude of the test signal to be further customized. Additional parallel integrators, when incorporated into the amplitude control system, correspondingly increase the number of initialized power levels for adjusting the amplitude of the test signal.

16 Claims, 3 Drawing Sheets

AMPLITUDE CONTROL SYSTEM HAVING PARALLEL INTEGRATING SIGNAL PATHS

FIELD OF THE INVENTION

The present invention relates to radio frequency (RF) signal generators and, more particularly, to an amplitude control system that provides for rapid switching between predefined power levels in an RF signal generator.

BACKGROUND OF THE INVENTION

Radio frequency (RF) signal generators produce test signals that simulate operating conditions in a variety of electronic systems. For example, signal generators provide amplitude, pulse and frequency modulated test signals for simulating target returns and antenna scan-patterns in radar systems. To simulate time-slot to time-slot changes in power levels of signals received by time domain multiple access (TDMA) cellular base stations, or to test squelch circuits and automatic gain control (AGC) circuits in receivers, it is desirable that the signal generator provide test signals having amplitudes that rapidly change between two precisely defined power levels. Unfortunately, slow response time of automatic level control (ALC) loops and electromechanical step attenuators in presently available signal generators impair the ability of the signal generators to provide this type of amplitude-adjusted test signal.

One system that rapidly adjusts the amplitude of a test signal between two precisely defined power levels incorporates two signal generators and a high speed switch. Each of the signal generators is set to a different power level and the switch rapidly connects either of the signal generators to an output. The power level of the test signal is dependent on which of the two signal generators is connected to the output. Although this system has high accuracy and high amplitude switching speed, use of two signal generators makes this type of system expensive, and separate control of the signal generators and the switch is cumbersome.

SUMMARY OF THE INVENTION

In accordance with the preferred embodiment of the present invention, an amplitude control system uses a pair of parallel integrators to rapidly adjust the amplitude of a test signal between two precisely determined power levels. The amplitude control system is readily incorporated into an ALC loop of a signal generator which produces test signals. The amplitude control system initializes a first power level by switching a first integrator into a feedback signal path. Once the amplitude control system balances, a first drive voltage corresponding to the first power level is thereby established at the first integrator. The first integrator is then disconnected from the feedback signal path and a second power level is initialized by switching a second integrator into the feedback signal path. When the amplitude control system balances, a second drive voltage, corresponding to the second power level is thereby established at the second integrator.

After initializing the power levels, the established drive voltage at each integrator is alternately applied to a level modulator which rapidly adjusts the amplitude of the test signal to each of the two initialized power levels in response to the applied drive signal. An electronic step attenuator and a burst modulator, when used in conjunction with the pair of parallel integrators, enable the difference between the initialized power levels to be increased beyond the dynamic range of components within the amplitude control system and also enable the amplitude of the test signal to be further customized. Additional parallel integrators, when incorporated into the amplitude control system, correspondingly increase the number of initialized power levels for adjusting the amplitude of the test signal.

DETAILED DESCRIPTION OF THE PREFERRED EMBODIMENT

Figure 1:
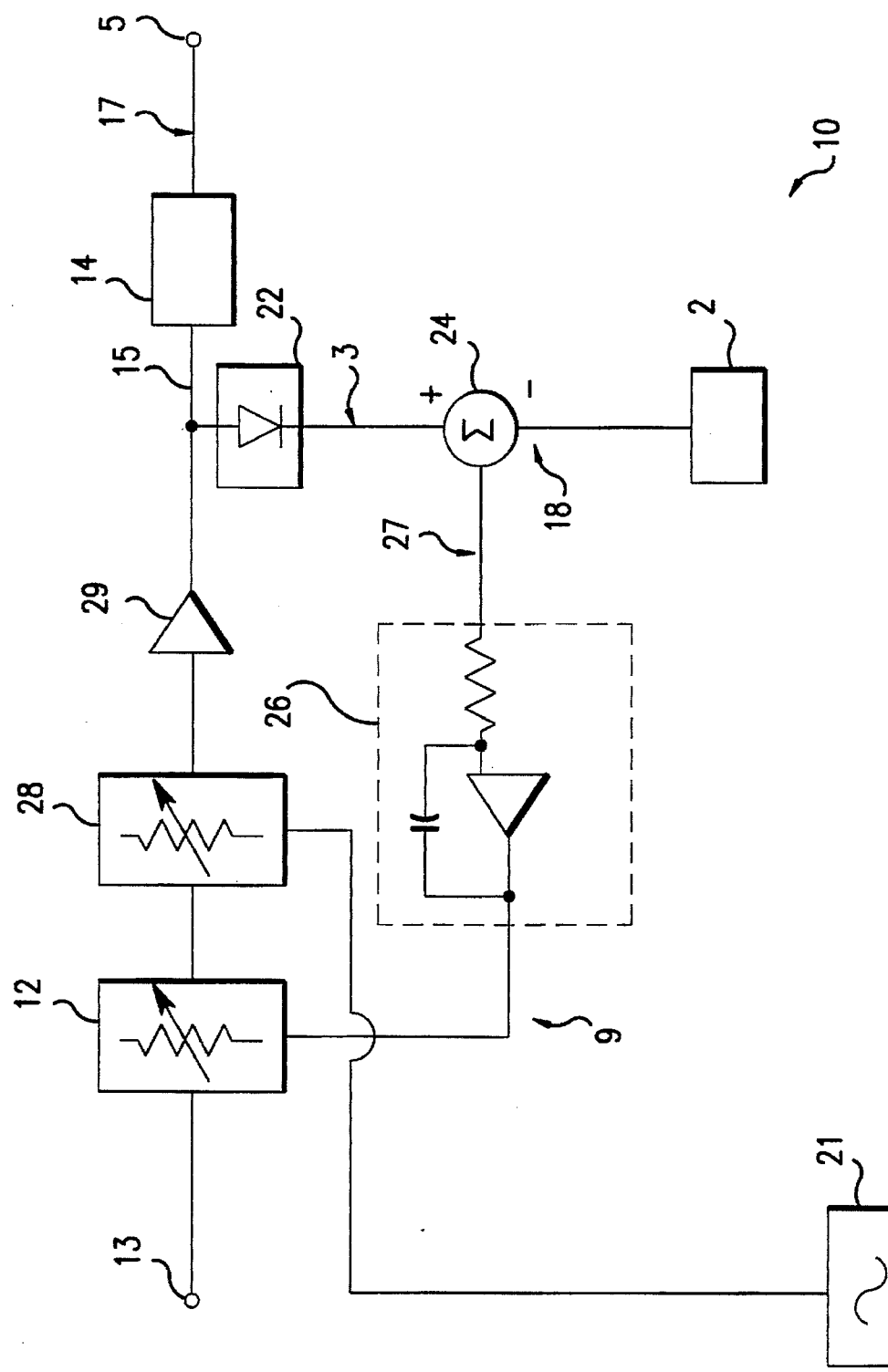
FIG. 1 shows a prior art automatic level control (ALC) loop used in a signal generator.

FIG. 1 shows a functional diagram of a prior art ALC loop 10, used in RF and microwave frequency signal generators. A forward path in the ALC loop 10 includes a level modulator 12, a loop input 13 and a loop output 15 which is coupled to an electromechanical step attenuator 14. The step attenuator 14 provides a test signal 17 at the signal generator's output 5. The loop input 13 receives an input signal from an oscillator or other source and a loop output signal is provided at the loop output 15. The power level of the loop output signal is controlled according to a reference voltage 18.

A feedback path in the ALC loop 10 includes a detector assembly 22, a summing junction 24 and a loop integrator 26. The detector assembly 22 samples the loop output signal and produces a detected voltage 3 based on the power level at the loop output 15. The detected voltage 3 and reference voltage 18 are each applied to a positive and a negative input, respectively, of the summing junction 24. The summing junction 24 forms an error signal 27 equal to the difference between the detected voltage 3 and reference voltage 18, and applies the error signal 27 to the loop integrator 26. For slowly varying error signals 27, the loop integrator 26 has high gain and amplifies the applied error signal 27 to generate a drive voltage 9 which is, in turn, applied to the level modulator 12 in the forward path. In response to the applied drive voltage 9, the level modulator 12 automatically adjusts the power level of the loop output signal so that the error signal 27 is minimized. The loop is balanced when the error signal 27 is minimized and the detected voltage 3 is equal to the reference voltage 18. When the reference voltage 18 is slowly changed, the ALC loop 10 automatically adjusts the power level at the loop output 15 to make the detected voltage 3 track the reference voltage 18.

The loop integrator 26 provides the dominant pole in the ALC loop 10, which determines the loop bandwidth. A narrow loop bandwidth is established to maintain the integrity of modulated input signals applied to the loop input 13, but the narrow loop bandwidth reduces the amplitude switching speed for the test signal 17 and limits the speed with which the detected voltage 3 can track the reference voltage 18. Thus, when reference 2 causes a rapid transition in the reference voltage 18, there is a time delay before the amplitude of the loop output signal adjusts to the transition and before the detected voltage 3 becomes equal to the reference voltage 18. A settling time occurs before the power level at the loop output 15 adjusts to the rapid transition of the reference voltage 18.

The step attenuator 14 increases the amplitude adjustment range of the test signal 17, beyond the adjustment range of the loop output signal. If the ALC loop 10 is opened by interrupting the feedback path, a burst modulator 28, driven from an internal source 21, provides for high speed amplitude adjustment of the test signal 17. However, accurate control of the amplitude of the test signal 17 is difficult due to this open loop control of the burst modulator 28 and due to nonlinear transfer functions inherent in known burst modulators 28. An amplifier 29 may be included in the forward signal path of the ALC loop 10 to provide high power test signals 17.

Figure 2:
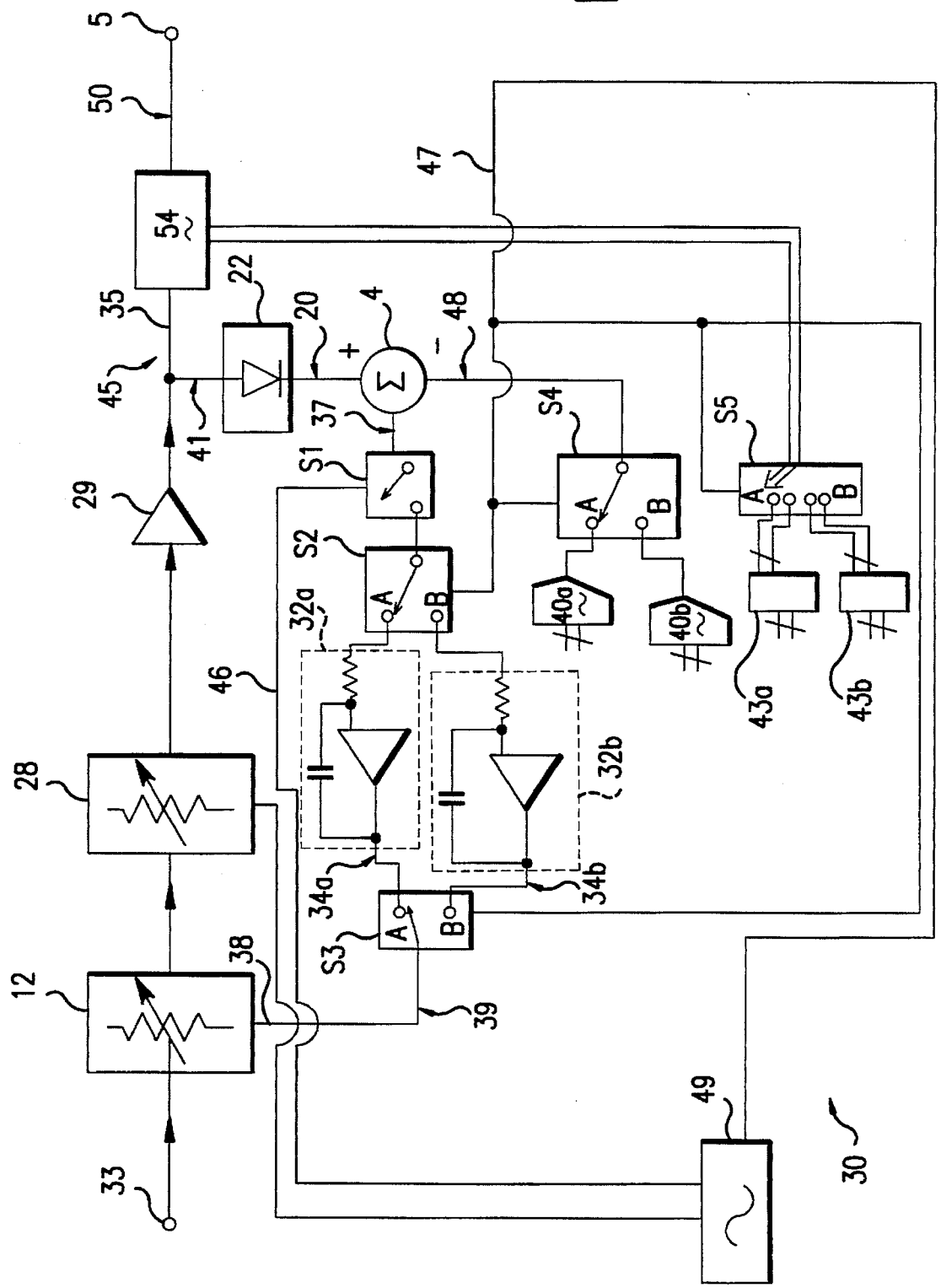
FIG. 2 shows an amplitude control system that is constructed in accordance with the preferred embodiment of the present invention.

FIG. 2 shows an amplitude control system 30 that is constructed in accordance with the preferred embodiment of the present invention. The amplitude control system 30 includes a pair of parallel integrators 32a, 32b and a pair of corresponding reference sources 40a and 40b, which are readily incorporated into an ALC loop of a signal generator. A forward signal path in the amplitude control system 30 includes a level modulator 12, a system input 33, a system output 35 and an optional high frequency amplifier 29. The level modulator 12 may be a PIN diode modulator, a FET modulator or other type of modulator, capable of adjusting the amplitude of RF and microwave-frequency signals in response to a drive signal 39 applied to the level modulator's control port 38.

A feedback signal path in the amplitude control system 30 includes a detector assembly 22, a summing node 4, and the pair of parallel integrators 32a, 32b. Switches S2 and S3 couple either of the parallel integrators 32a, 32b into the feedback signal path. The system output signal 45 is present at the system output 35 and is applied to the RF input 41 of the detector assembly 22. The detector assembly 22 is a silicon detector diode, used to sample the system output signal 45 and generate a detected voltage based on the power level of the system output signal. A logarithmic amplifier (not shown) may be used to process the detected voltage or to compensate for nonlinearities in the transfer function of the detector assembly 22 and form a detected signal 20. Log amplifiers used in conjunction with detector assemblies are known in the art and are present in commercially available signal generators, such as those produced by Hewlett-Packard Company of Palo Alto, Calif.

The forward signal path receives an RF or microwave-frequency input signal at the system input 33 and provides a system output signal 45 having a power level corresponding to a reference signal 48 applied to the summing node 4 by reference source 40a or reference source 40b. In a steady state configuration of the amplitude control system 30, switch S1 is closed and switches S2 and S3 are configured to position A so that integrator 32a is coupled into the feedback signal path of the amplitude control system 30. Switch S4 is configured to position A so that first reference source 40a is coupled to the negative input of the summing node 4. In the steady state configuration the amplitude control system 30 provides a function similar to an ALC loop, with integrator 32a providing the dominant pole in the system and establishing the system's bandwidth. A narrow system bandwidth is established to maintain the integrity of modulated RF or microwave frequency signals applied to the system input 33. The detected signal 20 is applied to the positive input of the summing node 4. The summing node 4 forms an error signal 37 at the summing node 4's output, that is equal to the difference between the detected signal 20 and the reference signal 48. The error signal 37 is amplified by integrator 32a which generates a drive voltage 34a at its output. Shaping circuits (not shown) may be used to process the drive voltages 34a and 34b or to compensate for nonlinearity of the transfer function of the level modulator 12 and form a drive signal 39. Shaping circuits such as exponentiators and voltage-to-current converters are known in the art. The drive signal 39, applied to the control port 38 of the level modulator 12, automatically adjusts the amplitude of the system output signal 45 so that the error signal 37 is minimized. Once the error signal 37 is minimized, the amplitude control system 30 is balanced and the detected signal 20 equals the reference signal 48.

While the amplitude control system 30 is in the steady state configuration, for slow transitions in the reference signal 48, the power level of the system output signal 45 automatically adjusts to the change in the reference signal 48 and the detected signal 20 tracks the reference signal 48, to minimize the error signal 37 and balance the amplitude control system 30. In response to step transitions and other rapid transitions in the reference signal 48 the amplitude control system 30 momentarily goes out of balance as the power level of the system output signal 45 and detected signal 20 cannot instantaneously adjust to minimize the error signal 37, due to the narrow bandwidth and slow response time of the amplitude control system 30.

Rapid transitions in the reference signal 48 and rapid adjustments of the power level of the system output signal 45 are accommodated using an amplitude switching configuration in the amplitude control system 30. In the amplitude switching configuration the power level of the system output signal 45 changes rapidly. The response time of the amplitude control system 30 is not limited by the narrow bandwidth and slow response time of the amplitude control system 30, established by the integrators 32a, 32b, but instead, the response time is dependent on the quick response of the level modulator 12 to the drive signal 39 applied to the control port 38.

To change the power level of the system output signal 45 between two predefined power levels, the power levels of the system output signals 45 are first initialized. A first predefined power level is initialized by connecting the reference signal 48 from the first reference source 40a to the negative input of the summing node 4 and by connecting the first integrator 32a into the feedback signal path, by setting switches S4, S2 and S3 to position A, under the control of the power control line 47. This forms a first integrating path in the amplitude control system 30. When the amplitude control system 30 balances, the drive voltage 34a corresponding to the first predefined power level is established at the output of the first integrator 32a. Similarly, a second predefined output power level is initialized by connecting the reference signal 48 from the second reference source 40b to the negative input of the summing node 4 and by connecting the second integrator 32b into the feedback signal path, by setting switches S4, S2 and S3 to position B, under the control of the power control line 47. This forms a second integrating path in the amplitude control system 30. When the amplitude control system 30 balances, the drive voltage 34b corresponding to the second predefined power level is established at the output of the second integrator 32b.

Once the first and second predefined power levels are initialized, the power level of the output signal is rapidly switched between the two initialized power levels by alternately coupling the drive voltages 34a and 34b of integrator 32a and 32b, respectively, into the feedback signal path of the amplitude control system 30. The power control line 47 also alternates connection of the negative input of the summing node 4 between the first and the second references 40a, 40b using switch S4. The reference sources 40a, 40b in this embodiment are provided by separate digital-to-analog converters (DACs) which provide reference voltages 48 at the inputs to switch S4. Alternatively, a single, fast switching DAC or other type of fast switching reference source may be used to provide the reference signal 48.

The power control line 47 alternates the error signal 37 between the inputs of integrator 32a and integrator 32b using switch S2, and also alternates connection of the drive voltages 34a and 34b to control port 38 using switch S3. For example, to switch the power level of the system output signal 45 from the first initialized power level to the second initialized power level, the power control line 47 activates switches S2, S3, and S4 into position B and integrator 32b couples to the feedback signal path of the amplitude control system 30, while the input and output of integrator 32a are disconnected from the feedback signal path. The drive voltage 34a at the output of integrator 32a remains at the level that the integrator 32a had when it was previously connected to the feedback signal path. The drive voltage 34b established previously during the initialization of the second power level at the output of integrator 32b is applied to the level modulator 12's control port 38. The level modulator 12 responds quickly, relative to the response time of the amplitude control system 30, to the applied drive signal 39 and adjusts the power level of the system output signal 45 to the second predetermined power level. Once switches S2, S3 and S4 are in position B, the drive voltage 34b at the output of integrator 32b is updated as the automatic control system responds to any slight variations in power level by driving any residual error signals 37 to zero.

To switch the power level of the system output signal 45 from the second initialized power level to the first initialized power level, the power control line 47 activates switches S2, S3 and S4 into position A, coupling integrator 32a to the feedback signal path of the amplitude control system 30, while the input and output of integrator 32b is disconnected from the feedback signal path. The drive voltage 34b at the output of integrator 32b remains fixed at the level that integrator 32b had when it was previously connected to the feedback signal path. Once switches S2, S3 and S4 are in position B, the drive voltage 34a at the output of integrator 32a is updated as the automatic control system 30 responds to any slight variations in power level by driving any residual error signals 37 to zero.

The power level of the system output signal 45 is toggled rapidly between the two initialized power levels according to the reference voltages 48, supplied by references 40a and 40b. Because the drive voltages 34a and 34b are established during initialization of the first and second power levels, there is negligible settling of the system output signal 45. The narrow bandwidth of the amplitude control system 30, established by integrators 32a, 32b, maintains the integrity of modulated input signals applied to the system input 33. However, in the amplitude switching configuration of the amplitude control system 30, the narrow bandwidth does not limit the amplitude switching speed of the system output signal 45. Because the drive voltages 34a and 34b are established at the outputs of integrators 32a and 32b, respectively, unwanted switching transients, such as settling tails or overshoot, in the amplitude of the system output signal 45 are avoided as the system output signal 45 transitions to each of the two initialized power levels.

Although the two initialized power levels may be within the dynamic range of the level modulator 12 and detector assembly 22 of the amplitude control system 30, some electronic systems have requirements for test signals 50 having power level differences that exceed this dynamic range. A high speed electronic step attenuator 54, used in conjunction with the amplitude control system 30, supplies additional adjustment range so that the signal generator may produce test signals 50 having power level differences exceeding the limited dynamic range of the level modulator 12 and the detector assembly 22. Control for the electronic step attenuator 54 corresponding to the first initialized power level and the second initialized power level is supplied from attenuator registers 43a and 43b, respectively, which are selected using switch S5 under the control of the power control line 47. The attenuator registers 43a, 43b and the switch S5 avoid delays attributable to interrupt driven microprocessor controlled commands that typically occur when the signal generator is controlled from a remote source such as an external computer. The output of the step attenuator 54 provides the test signal 50 at the generator output 5.

Figure 3:
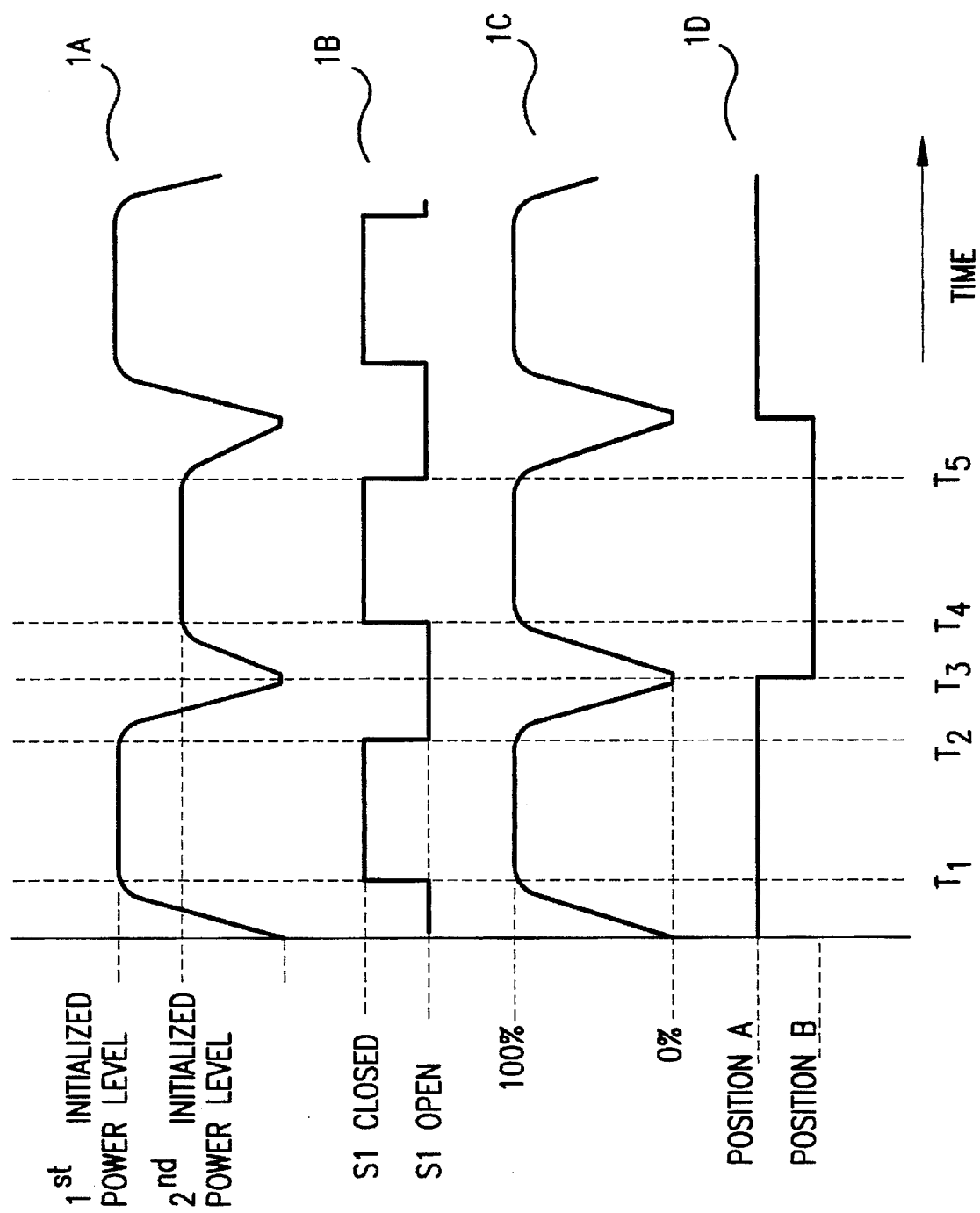
FIG. 3 shows a timing diagram for signals in the amplitude control system.

A burst modulator 28 used in conjunction with the amplitude control system 30 and the step attenuator 54 may be used to customize the test signal 50 produced at the signal generator output 5, to simulate operating conditions in a variety of electronic systems. FIG. 3 shows a timing diagram for signals in the amplitude control system 30 for generating a test signal 50 used to simulate time-slot to time-slot changes in power levels of signals received by a TDMA cellular base station. Trace 1A shows the amplitude of the test signal 50 at the signal generator's output. Trace 1B shows the position of switch S1. Trace 1C shows the control voltage applied to the burst modulator 28. Trace 1D shows the state of the power control line 47. Trace 1B, trace 1C and trace 1D are driven from a pattern source 49, which may be internal or external to the signal generator.

From time T1 to time T2 the power level of the test signal 50 is constant and equal to the first initialized power level. Switch S1 is closed under the control of the HOLD control line 46 and switches S3, S2, S5 and S4 are in position A. This couples integrator 32a into the feedback signal path of the amplitude control system 30 and sets the step attenuator 54 to the attenuation level according to the value in attenuator register 43a. Reference signal 40a is also connected to the summing node 4. Any residual error signals 37 are reduced as the amplitude control system 30 balances. From time T2 to time T3, the power level of the test signal 50 ramps down, or decreases. Switch S1 is opened at time T2, interrupting the feedback signal path of the amplitude control system 30. The ramp is provided by the burst modulator 28 and corresponds to the control voltage applied to the burst modulator 28. At time T3, switch S1 remains open but switches S3, S2, S5 and S4 are switched by the power control line 47 to position B. From time T3 to time T4, the power level of the test signal 50 ramps up, or increases, under control of the burst modulator 28 until the second initialized power level is reached at time T4. At time T4, switch S1 is closed and the integrator 32b is coupled into the feedback signal path of the amplitude control system 30. The second power level is maintained between time T4 and time T5 and any residual error signals 37 are reduced in this time interval as the amplitude control system 30 balances.

An example of a specific test signal 50 that is amplitude controlled by the amplitude control system 30 is shown in FIG. 3. Various types of test signals 50 can be formed using the amplitude control system 30 in coordination with the electronic step attenuator 54 and burst modulator 28. Additional parallel integrators and additional switches are readily incorporated into the amplitude control system 30 to increase the number of predefined power levels for adjusting the amplitude of the test signals 50 produced by the signal generator.

What is claimed is:

1. An amplitude control system for adjusting the amplitude of a test signal to each of at least two power levels, the amplitude control system comprising:

a modulator for adjusting the amplitude of the test signal in response to an applied control signal;

a detector assembly for sampling the test signal and producing a detected signal according to the power level of the test signal;

a summing node coupled to the detector assembly and having a reference input for receiving an applied reference signal, the summing node producing an error signal proportional to the difference between the detected signal and the applied reference signal;

a first integrator for receiving the error signal and generating a first control signal in response to the error signal;

a second integrator for receiving the error signal and generating a second control signal in response to the error signal;

a first switch for coupling the error signal to one of the first and the second integrators; and a second switch for coupling one of the first and the second control signals to the level modulator, wherein the test signal has a first power level when the error signal is coupled to the first integrator and when the first control signal is coupled to the level modulator, and the test signal has the second power level when the error signal is coupled to the second integrator and when the second control signal is coupled to the level modulator.

2. The amplitude control system of claim 1 wherein the first control signal has a first value that is maintained when the second control signal is coupled to the level modulator and the second control signal has a second value that is maintained when the first control signal is coupled to the level modulator.

3. The amplitude control system of claim 1 further comprising a series switch coupled between the summing node and the first switch, operating to couple and decouple the error signal and the first switch.

4. The amplitude control system of claim 3 further comprising a burst modulator coupled to the level modulator, the burst modulator receiving the test signal and adjusting the amplitude of the test signal when the error signal is decoupled from the first switch.

5. An amplitude control system for adjusting the amplitude of a test signal to each of at least two predefined power levels, comprising:

a first reference signal corresponding to a first predefined power level;

a second reference signal corresponding to a second predefined power level;

a detector assembly for sampling the test signal and producing a detected signal according to the power level of the test signal;

a summing node coupled to the detector assembly and having a reference input for receiving one of the first and the second reference signals, the summing node producing an error signal proportional to the difference between the detected signal and the received one of the reference signals;

a first integrator receiving the error signal and generating a first control signal in response to the error signal;

a second integrator receiving the error signal and generating a second control signal in response to the error signal;

level modulator for adjusting the amplitude of the test signal in response to an applied control signal;

a first switch for coupling the error signal to one of the first and the second integrators;

a second switch for coupling one of the first and the second control signals to the level modulator; and a third switch for coupling one of the first and the second reference signals to the reference input, wherein the test signal has the first predetermined power level when the error signal is coupled to the first integrator, when the first control signal is coupled to the level modulator and when the first reference signal is coupled to the reference input, and the test signal has the second predetermined power level when the error signal is coupled to the second integrator, when the second control signal is coupled to the level modulator and when the second reference signal is coupled to the reference input.

6. The amplitude control system of claim 5 wherein the first control signal has a first value that is maintained when the second control signal is coupled to the level modulator and wherein the second control signal has a second value that is maintained when the first control signal is coupled to the level modulator.

7. The amplitude control system of claim 5 further comprising a first digital-to-analog converter generating the first reference signal when the first reference is coupled to the reference input, and a second digital-to-analog converter generating the second reference signal when the second reference is coupled to the reference input.

8. The amplitude control system of claim 5 further comprising a step attenuator coupled to the level modulator, receiving the test signal and attenuating the test signal by a first preset attenuation value when the test signal has the first predefined power level and attenuating the test signal by a second preset attenuation value when the test signal has the second predefined power level.

9. The amplitude control system of claim 5 further comprising a series switch coupled between the summing node and the first switch, operating to couple and decouple the error signal and the first switch.

10. The amplitude control system of claim 9 further comprising a burst modulator coupled to the level modulator, the burst modulator receiving the test signal and adjusting the amplitude of the test signal when the error signal is decoupled from the first switch.

11. A method for alternately adjusting the amplitude of a test signal to each of at least two power levels in a feedback control system having a pair of parallel integrators in a feedback signal path and having a level modulator in the forward signal path, the method comprising the steps of:

initializing a first power level by establishing a first control signal on a first integrator of the pair of parallel integrators;

initializing a second power level by establishing a second control signal on a second integrator of the pair of parallel integrators;

alternately applying one of the first control signal the second control signal to the level modulator to generate a first and a second power level.

12. The method of claim 11 further comprising the steps of maintaining the signal level of the first control signal when the second control signal is coupled to the level modulator and maintaining the signal level of the second control signal when the first control signal is coupled to the level modulator.

13. The method of claim 11 further comprising the steps of updating the signal level of the first control signal when the first control signal is coupled to the level modulator, and updating the signal level of the second control signal when the second control signal is coupled to the level modulator.

14. The method of claim 11 further comprising the steps of coupling the first integrator to the feedback signal path and coupling a first reference signal to the feedback control system when the first control signal is applied to the level modulator, and further comprising the steps of coupling the second integrator to the feedback signal path and coupling a second reference signal to the feedback control system when the second control signal is applied to the level modulator.

15. The method of claim 11 wherein the step of initializing the first power level further includes the steps of:

coupling the first integrator into the feedback signal path;

applying a first reference signal to the feedback control system; and balancing the feedback control system so that the first power level is achieved in response to the applied first reference signal; and wherein the step of initializing the second power level further includes the steps of;

coupling the second integrator into the feedback signal path;

applying a second reference signal to the feedback control system; and balancing the feedback control system so that the second power level is achieved in response to the applied second reference signal.

16. The method of claim 15 further comprising the steps of decoupling the first and the second integrators from the feedback signal path and amplitude modulating the test signal in the forward signal path.

* * * * *